United States Patent
Ramirez, III

(10) Patent No.: US 10,608,145 B2
(45) Date of Patent: Mar. 31, 2020

(54) ILLUMINATION DEVICE FOR DESORBING MOLECULES FROM INNER WALLS OF A PROCESSING CHAMBER

(71) Applicant: APPLIED MATERIALS, INC., Santa Clara, CA (US)

(72) Inventor: Ricardo Mateo Ramirez, III, Bastrop, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/682,921

(22) Filed: Aug. 22, 2017

(65) Prior Publication Data

US 2018/0323348 A1 Nov. 8, 2018

Related U.S. Application Data

(60) Provisional application No. 62/502,098, filed on May 5, 2017.

(51) Int. Cl.
| | |
|---|---|
| H01L 21/67 | (2006.01) |
| C23C 16/44 | (2006.01) |
| H01L 33/48 | (2010.01) |
| H01L 27/15 | (2006.01) |

(52) U.S. Cl.
CPC ........ *H01L 33/483* (2013.01); *C23C 16/4401* (2013.01); *H01L 21/67115* (2013.01); *H01L 21/67253* (2013.01); *H01L 27/153* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 4,660,297 A | 4/1987 | Danielson | |
| 7,316,262 B1 * | 1/2008 | Rini | F28D 20/023 165/10 |
| 2006/0043067 A1 * | 3/2006 | Kadkhodayan | C04B 35/505 216/67 |
| 2008/0285271 A1 * | 11/2008 | Roberge | F21S 8/033 362/235 |
| 2009/0310363 A1 * | 12/2009 | Liu | F21K 9/00 362/249.02 |
| 2015/0267293 A1 * | 9/2015 | Motoyama | C23C 16/4411 427/255.28 |
| 2016/0111618 A1 | 4/2016 | Shur et al. | |

(Continued)

OTHER PUBLICATIONS

Aquisense Technologies, UV-C LED Basics, URL: http://www.aquisense.com/technology, Nov. 5, 2017.

*Primary Examiner* — Seahvosh Nikmanesh
*Assistant Examiner* — Xiaoming Liu
(74) *Attorney, Agent, or Firm* — Schwabe, Williamson & Wyatt, P.C.

(57) ABSTRACT

An illumination device is described for desorbing molecules from inner walls of a processing chamber. In some examples, the device includes a chassis, a plurality of light emitting diodes (LEDs) mounted to the chassis, wherein the plurality of LEDs emit ultraviolet (UV) radiation when electrically powered, a thermally non-conductive main housing surrounding the chassis and configured to be placed on a wafer carrier of the processing chamber, and an electrical system to activate the LEDs within the processing chamber.

18 Claims, 6 Drawing Sheets

(56) References Cited

U.S. PATENT DOCUMENTS

2016/0131352 A1* 5/2016 Thirunavukarasu ... H05K 1/112
    362/249.02
2016/0302258 A1* 10/2016 Hayashi ............... H05B 1/0233
2017/0104135 A1   4/2017 Shur et al.

* cited by examiner

ILLUMINATION DEVICE FOR DESORBING MOLECULES FROM INNER WALLS OF A PROCESSING CHAMBER

CROSS-REFERENCE TO RELATED APPLICATION

The present application claims priority to prior U.S. Provisional Application Ser. No. 62/502,098 filed May 5, 2017, entitled ILLUMINATION DEVICE FOR DESORBING MOLECULES FROM INNER WALLS OF A PROCESSING CHAMBER, by Ricardo Mateo Ramirez, III.

FIELD

The present description relates to semiconductor processing chambers and in particular to removing impurities from such a chamber.

BACKGROUND

In the manufacture of semiconductor chips a silicon wafer or other substrate is exposed to a variety of different processes in different processing chambers. The chambers may expose the wafer to plasmas, chemical vapors, metals, laser etching, and various deposition and acid etching processes in order to form circuitry and other structures on the wafer. During these processes, the integrity of the chamber against leaks and impurities is important to ensure that each wafer is the same as the last wafer.

During manufacture and occasionally after a period of use a vacuum chamber for the wafer processing equipment is tested for leaks. The tests verify that a sufficient level of vacuum can be maintained. In some cases, a leak detector, which can be a self-contained mass spectrometer tuned to the mass of helium, is used to scan for the presence of helium within a vacuum chamber. The helium leak rate can indicate that the vacuum chamber requires repair. During manufacture and use water vapor and other molecules may be deposited on the walls of the chamber. These molecules are removed before the chamber is put into service in processing more wafers. In some cases hot cathode mercury discharge tubes are placed into the chamber to break up the molecules.

SUMMARY

An illumination device is described for desorbing molecules from inner walls of a processing chamber. In some examples, the device includes a chassis, a plurality of light emitting diodes (LEDs) mounted to the chassis, wherein the plurality of LEDs emit ultraviolet (UV) radiation when electrically powered, a thermally non-conductive main housing surrounding the chassis and configured to be placed on a wafer carrier of the processing chamber, and an electrical system to activate the LEDs within the processing chamber.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
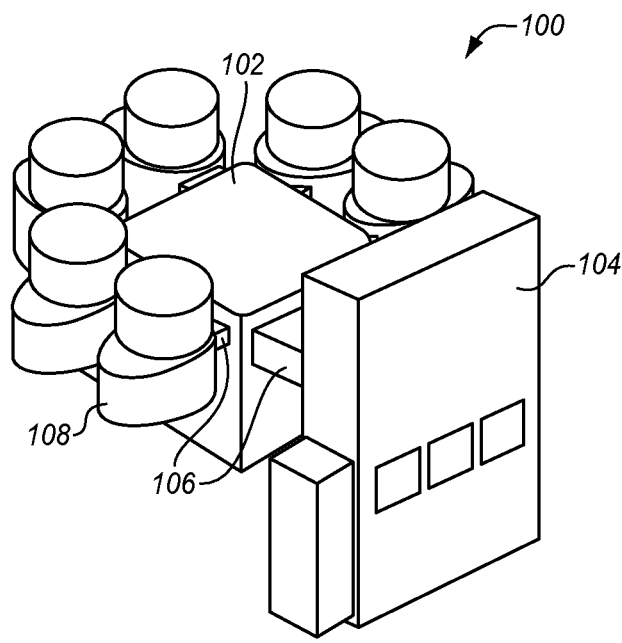
FIG. 1 is an isometric diagram of a wafer processing tool suitable for use with embodiments described herein.

Devices and methods used for desorbing molecules from a chamber wall are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, the various embodiments shown in the accompanying drawings are illustrative representations and are not necessarily drawn to scale.

Semiconductor equipment can be tested for leaks under a vacuum, e.g., in the $10^{-4}$ Torr range using a leak detector. Pumping down the chamber to the base pressure, however, can require a substantial time duration. For example, an initial pump down time can be an hour. Furthermore, subsequent pump down times, i.e., after a vacuum has been broken and air has been allowed into the chamber, can be more than an hour. The lengthy pump down time is caused, at least in part, by water molecules adsorbed in the chamber walls. Desorption of the water molecules is required to reach a test pressure and requires a lengthy exposure to the vacuum.

Dedicated hot cathode mercury discharge tubes have been used to energize water vapor molecules within vacuum chambers. Such dedicated lamps, however, are not transferable between multiple chambers of a wafer processing tool, and furthermore, such dedicated lamps require specific modifications to the process chambers, such as pass-through flanges and mounting brackets, to allow for an external power supply to energize the lamp.

In an aspect of embodiments described herein, a desorption device includes a main housing having a wafer form factor. The desorption device can be loaded into a semiconductor equipment vacuum chamber using operations typical of the semiconductor processes that the vacuum chamber is used to perform. More particularly, the desorption device can be transferred into any of several vacuum chambers in a wafer processing tool. The desorption device includes several light emitting diodes (LEDs) mounted on a chassis within the housing to direct radiation, e.g., ultraviolet (UV) radiation, toward walls of the vacuum chamber. The LEDs can be powered locally by a power source of the desorption device, and thus, no modification to the vacuum chamber or external power supply is required for the desorption device to function. The LEDs irradiate the chamber walls such that water molecules are energized and desorbed from the chamber wall more quickly than under vacuum alone. Accordingly, a requisite test pressure, e.g., in a range of $10^{-4}$ Torr or less, can be achieved within the vacuum chamber more quickly using the desorption device than is currently possible under vacuum alone. Thus, manufacturing quality testing of one or more vacuum chambers of a wafer processing tool can be performed effectively using the desorption device.

The desorption devices and methods described below could be used in any form factor or process where desorption of molecules from a chamber wall expedites pressure changes. More particularly, although the desorption devices and methods are described with respect to testing for leaks in process chambers used for the fabrication of integrated circuits, the devices and methods may also be adapted for use in other technologies, such as process chambers used for the fabrication of displays in the electronics industry and/or photovoltaic cells in the solar industry.

Referring to FIG. 1, a wafer processing tool is illustrated in accordance with an embodiment. A wafer processing tool 100 may include a buffer chamber 102 physically connected to a factory interface 104 by one or more load locks 106. Furthermore, one or more process chambers 108 may be physically connected to the buffer chamber 102 by one or more respective load locks 106. Buffer chamber 102 may essentially act as an intermediate volume, larger than respective volumes of process chambers 108, that remain at a low pressure, albeit at a pressure higher than the process pressures within process chambers 108. Thus, a semiconductor wafer, e.g., a silicon wafer, may be moved between chambers of wafer processing tool 100 under vacuum conditions during the manufacture of semiconductor devices. This movement may be enabled by various devices included in the wafer processing tool 100, e.g., robotic arms, shuttles, etc.

Various manufacturing operations may be performed in the processing chambers 108. For example, at least one of the processing chambers 108 may be a plasma etch chamber, a deposition chamber, a chamber of a semiconductor lithography tool, or any other semiconductor process tool chamber. As such, a process chamber 108 may be used to perform manufacturing processes under vacuum conditions. By way of example, manufacturing processes may be performed under vacuum conditions in the $10^{-6}$ Torr range or lower, e.g., in the $10^{-8}$ Torr range.

The ability to maintain vacuum without ingress of the surrounding environment, i.e., without leaks, is critical to achieving a robust wafer manufacturing process. Leaks can happen, however, and are most likely to occur at certain locations such as O-ring seals, metal gaskets, shut-off valves, and chamber welds, in load lock 106 or process chamber 108.

In an embodiment, load lock 106 or process chamber 108 can be tested during or after the fabrication of the wafer processing tool 100 to detect the presence of leaks. By way of example, a leak detector can be connected to an internal chamber volume of the process chamber 108 and all ports of process chamber 108, e.g., load lock 106, or a chamber door, can be sealed. A test gas, such as helium, may be applied externally around the process chamber 108 at the locations where leaks are most likely to occur, and the leak detector can sense whether the test gas is detected within the sealed volume. If the test gas is detected, a leak is determined to be present.

As described above, leak testing can be performed with the process chamber 108 under a predetermined vacuum level, and achieving that vacuum level can be expedited by irradiating the chamber walls of the process chamber 108 to desorb water vapor molecules. The water vapor molecules may have been adsorbed, for example, by anodized chamber walls of the process chamber 108 during a previous venting cycle of the process chamber 108. In an embodiment, irradiation of the process chamber 108 may be performed using a desorption device that is transferable throughout the wafer processing tool 100, as described below.

Figure 2:
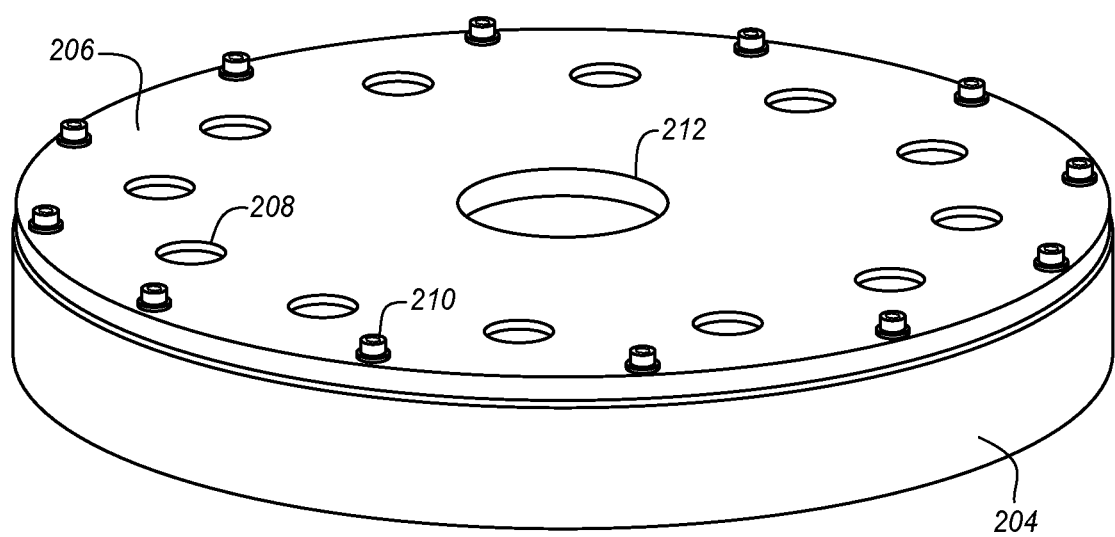
FIG. 2 is an isometric view of a desorption device suitable for use in the tool of FIG. 1 and other types of processing tools according to an embodiment.

Referring to FIG. 2, a desorption device is illustrated in accordance with an embodiment. A desorption device for absorbing molecules from a chamber wall of process chamber 108 may include a wafer or substrate-shaped main housing 204 and a lid or cover 206. In an embodiment, the main housing form factor is essentially disc-shaped and formed of a resilient thermally nonconductive material that is able to sustain pressure and temperature variations without significant thermal expansion or damage. Rexolite® or another suitable polystyrene, plastic, epoxy, or other dielectric material may be used. The main housing may be sized with a diameter similar to or the same as readily-available semiconductor wafers, e.g. 95 to 455 mm, and particularly 100 mm, 300 mm, or 450 mm. The particular size may be selected based on the design of the process chamber in which it will be used. The thickness may be the same as or greater than that of a wafer provided that it can be accommodated in the process chamber.

The desorption device has a cover 206 attached to the main housing 204 with screws 210, bolts or another suitable removable fastener. The cover has an array of windows 208 and a central access port 212. The windows allow light from an array of LEDs to propagate from the desorption device to the process chamber walls. The windows are shown in a single circular pattern of twelve windows near the edge of the cover. The particular pattern may be adapted to suit the size of the desorption device, the size of the chamber, and the illumination characteristics of the LEDs. In the illustrated embodiment, the LED windows 208 are mounted on the top cover 206. The LED windows may be symmetrically disposed about a central axis extending orthogonal to the top surface of the cover. For example, each LED may be located at a fixed radius from the central axis and an arc angle between radial lines. Each LED may be separated from an adjacent LED by an arc angle of 30 degrees.

The wafer form factor of the desorption device allows the device 20 to be manufactured using readily available materials. Accordingly, the device may essentially be handled like a semiconductor wafer that is to be processed by wafer processing tool 100. Furthermore, the wafer form factor of substrate 202 allows the desorption device to be moved between chambers of the wafer processing tool 100.

Figure 3:
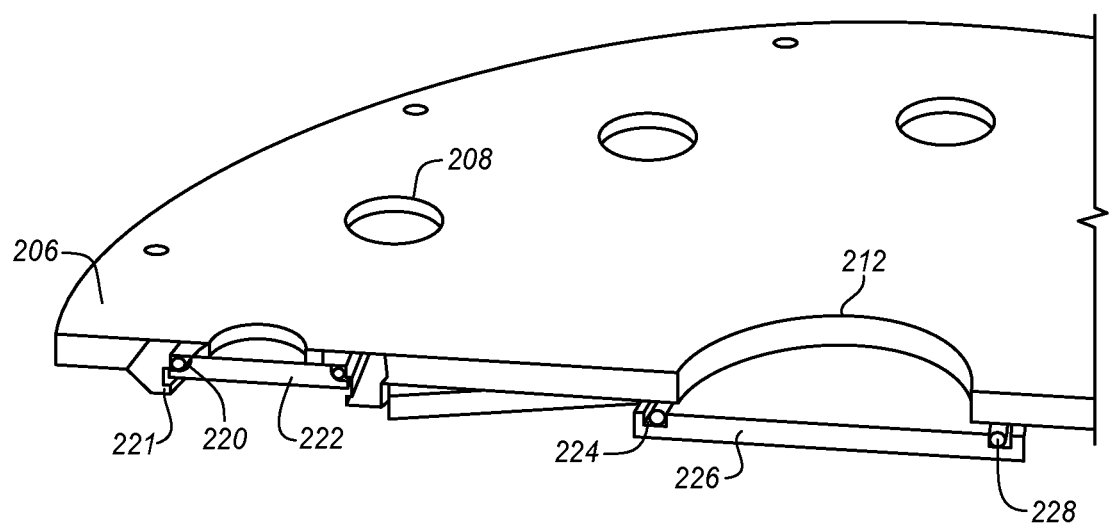
FIG. 3 is an isometric cross-sectional view of a portion of the top cover of a desorption device according to an embodiment.

FIG. 3 is an isometric and cross-sectional view of the top cover 206 removed from the main housing 204. As shown, for each window 208 there is a circular opening through the top cover, although the openings may have other shapes to suit the characteristics of the LED and the desired light distribution pattern. A lens carrier is formed in the top cover below the opening. The lens carrier includes a gasket seat at the top of the carrier and a retaining ring 221 around the bottom of the carrier. An O-ring or other gasket 220 rests against the seat of the carrier. A lens or window 222 rests against the retaining ring 221 and is held in the carrier by the retaining ring. The window has an outer ledge in the form of a step around the rim of the circular window. With the flat gasket seat, the window defines a groove to contain the O-ring 220 between the window and the gasket seat. Alternatively, the window may have a flat surface and a ledge or groove may be formed in the top cover to confine the O-ring.

The window in this example is a quartz or acrylic disk that is flat on both sides except for the optional peripheral ledge to contain the O-ring 220. The lens may be a plain sheet that does not have an optical power or magnification nor any surface texture. Depending on the implementation, the window may be a concave lens to spread the light from the LED, a convex lens to focus the light from the LED, or a diffractive or Fresnel surface to direct the light in any desired way. The window serves to protect the LEDs and other components within the main housing. In addition, the window provides a gas flow barrier. When the housing is heated or the chamber is evacuated the desorption device at ambient pressure becomes a pressure vessel.

In use, the LEDs and other electrical components in the main housing including the battery described below generate heat. This heat can negatively affect the time required to reach the desired vacuum and the desorption of water inside the chamber. In order to prevent the heat from the desorption device from negatively affecting the process, the desorption device is sealed. The sealing also serves to prevent any stray or outgassed molecules within the main housing from being released into the pressure chamber.

The seals described herein for the desorption device take advantage of two characteristics of the leakage test. First, the desorption device heats up under use. This increases the air pressure inside the desorption device. Second, as the vacuum pump empties the chamber, the air pressure outside the desorption device will be lower than the ambient pressure or heat-elevated pressure within the main housing.

The window 222 is placed between the interior of the main housing and the O-ring 220. As pressure inside the main housing increases, the window is pressed upwards against the O-ring. The O-ring is pressed upwards against the seat in the top cover 206. The greater the pressure differential between the interior of the main housing and the exterior within the chamber, the tighter the seal. When the top cover is made from a material with poor thermal conductivity, then higher temperatures will cause even greater sealing against releasing heat into the chamber and against outgassing.

A similar approach is taken with a central access port 212 of the top cover. The access port is sealed by a port cover 226. The port cover has an O-ring groove 224 on its top surface near its periphery. The port cover is larger than the access port so that the O-ring groove is completely outside of the access port when the port cover is covering the port. An O-ring 228 is carried in the groove and when the port cover is pressed upwards away from the main housing interior, it presses the O-ring against the bottom of the top cover. This seals the port cover against the access port and prevents the port cover from moving. When the pressure is released, then the port cover slides along rails (not shown) in the bottom surface of the top cover as shown in FIG. 4.

The windows 222 each have a ledge to hold an O-ring 226 against top and side walls of a carrier formed in the top cover. On the other hand, the port cover 226 has a groove 224 to hold an O-ring 228 against a flat upper surface of the bottom of the top cover 206. Either type of O-ring retention structure may be used for either purpose. Alternatively, there may be a groove in the top cover to retain the O-ring.

Figure 4:
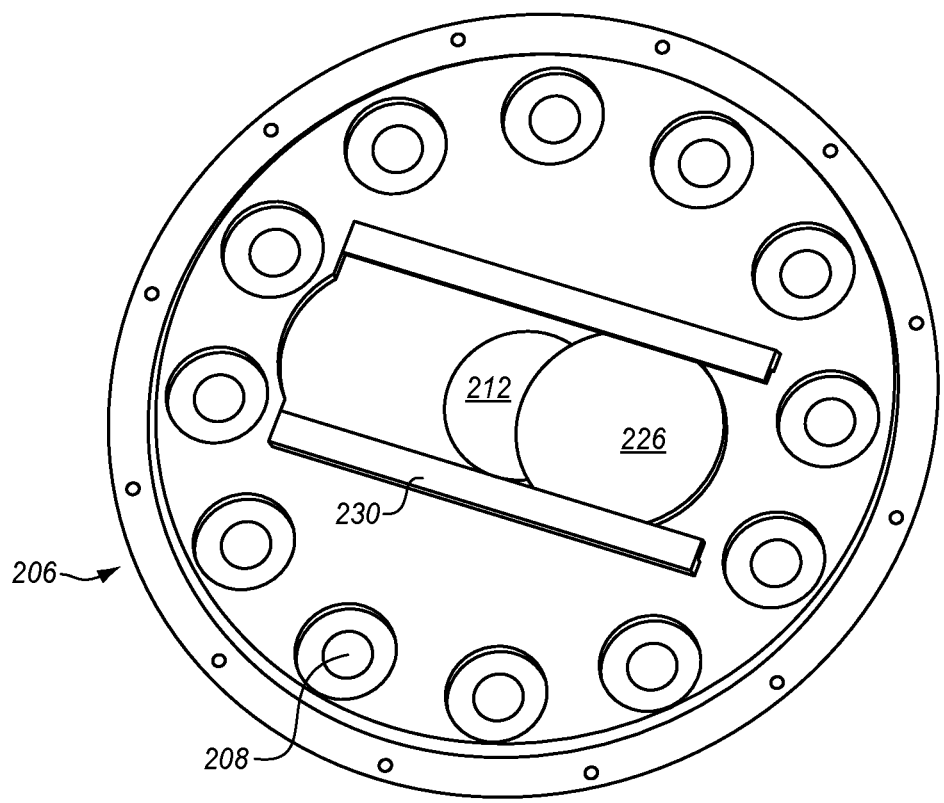
FIG. 4 is a bottom plan view of the top cover of a desorption device according to an embodiment.

FIG. 4 is a bottom plan view of the top cover 206 without any windows in the openings 208 and without the retaining screws. A pair of rails 230 is welded, molded into or otherwise attached or formed to the bottom surface of the top cover. The rails extend beside the access port 212 and retain the port cover 226. This allows the port cover to slide away from the access port and allow access into the main housing without removing the top cover. As shown in FIG. 3, the port cover holds the O-ring 226 so that the O-ring moves to the side as the port cover moves to the side. The rails may be configured to allow some vertical travel of the port cover. In this way when the pressure on either side of the port cover is equalized, the port cover slides easily to the side, but when the pressure is higher on the bottom side of the top cover, the port cover is pressed vertically upwards, seals against the top cover, and does not slide.

The position of the port cover 226 may be secured using spring pins, bumps, extrusions, tabs and other structures. An extrusion that aligns to the view port may be used to properly align the cover to seal in use. This extrusion may have a generous radius to allow for slip. In one example, described below, a spring-loaded button may be used as a latch to hold the cover in place.

Figure 5:
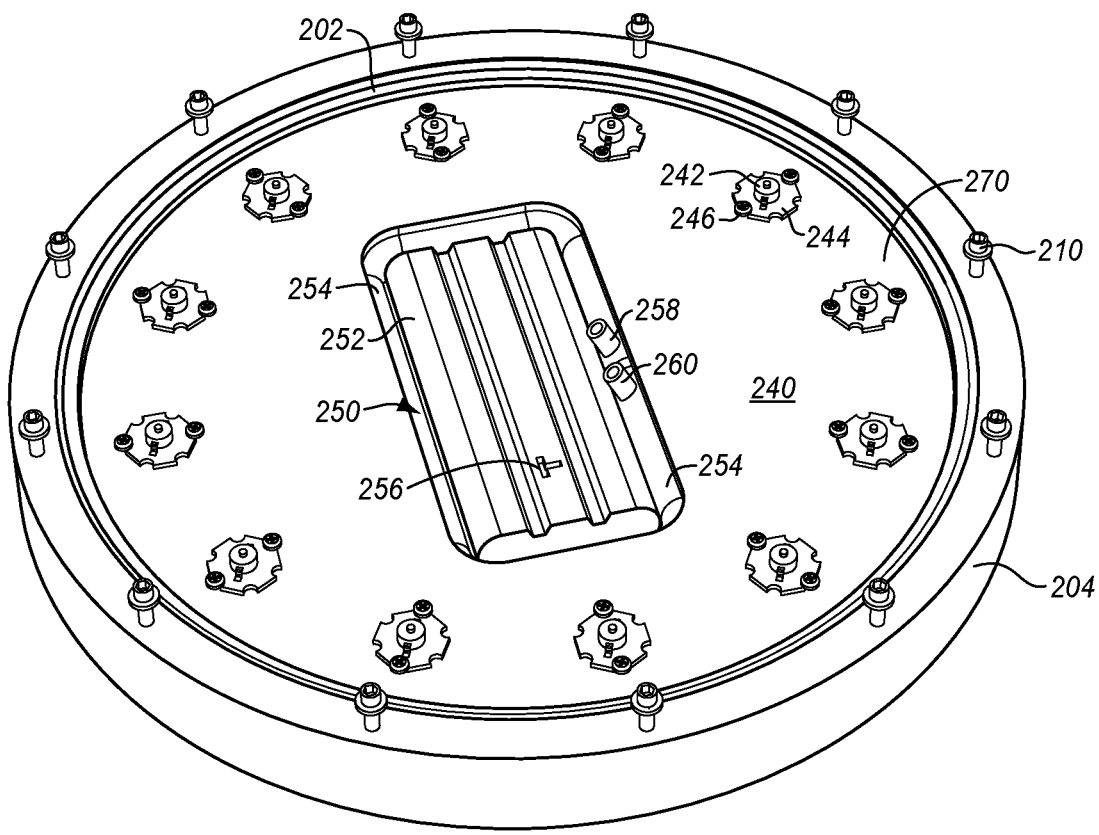
FIG. 5 is an isometric view of a desorption device with the top cover removed according to an embodiment.

FIG. 5 is an isometric view of the main housing 204 with the top cover removed showing the retaining screws 210 and an inner gasket 202, such as an O-ring that seals the main housing against the top cover when the top cover is in place. The main housing carries an inner chassis 240. The chassis has a top deck to support the LEDs 242. The LEDs are each attached to a small printed circuit board (PCB) 244 which has slots to allow it to be screwed into the chassis with a pair of screws 246. The LEDs may be attached with any other desired fastener. The mounting PCB and screws allow for convenient replacement of any faulty LED when the desorption device is in service.

The desorption device chassis 240 has twelve LEDs 242, one for each window 208. The LEDS are positioned directly underneath each window. There may be additional LEDS to spread light in other directions within the pressure chamber. As an example, one or more LEDs may be mounted on a lateral edge or a bottom surface of the device.

The chassis also includes a battery well 250. The battery well provides a conformal opening to carry a battery 252 and a battery cooler 254 in the form of a pipe that surrounds the battery. The pipe is shown as only surrounding the lateral edges of the battery but may also extend under and over the battery to conduct heat away from more of the battery. In some embodiments, the battery has a heat fin, heat pipe, or other fitting to connect a thermal device to conduct heat away from the interior of the battery. In such a case the pipe may be configured to thermally connect with this fitting. The pipe has an input 258 and an output 260 coupler. The coupler may be connected to a coolant source internally within the chassis or to an external source. In some use scenarios, the pipe is empty during a pressure test. When the desorption device is removed from the pressure chamber, the port cover is pushed aside and the source of coolant, such as compressed dry air is coupled to the couplers to cool the battery in preparation for another use cycle. There is also an electrical connector 256 on the top of the battery 252. In the illustrated example, the electrical connector is positioned at one end of the battery. This allows the battery to be recharged by opening the access port and connecting a charger in between leakage tests.

The rechargeable battery is provided as one example of a power source for the LEDs. The battery may be coupled to each LED through a wiring system (not shown) either on the top surface of the chassis or through some other passageway or conduit. There may also be a circuit to control the operation of the LEDs to regulate power of the LEDs and to allow remote operation of the LEDs. A different power source may be used, such as a fuel cell, a flywheel and dynamo, a capacitor, or any other suitable electric source. The cooling pipe is shown as one example. A cooling system may be adapted to suit such other sources. Each of these power sources may be configured so that the desorption device operates without any external connections. This allows the desorption device to be used without any access port or connector in the processing chamber. The desorption device may be treated just as a wafer is treated. For some uses, there may be power and cooling connections within the processing chamber. For such a chamber, the desorption device may have direct connections to the chamber's power and coolant in which case, no battery or other self-contained power source is required.

Figure 6:
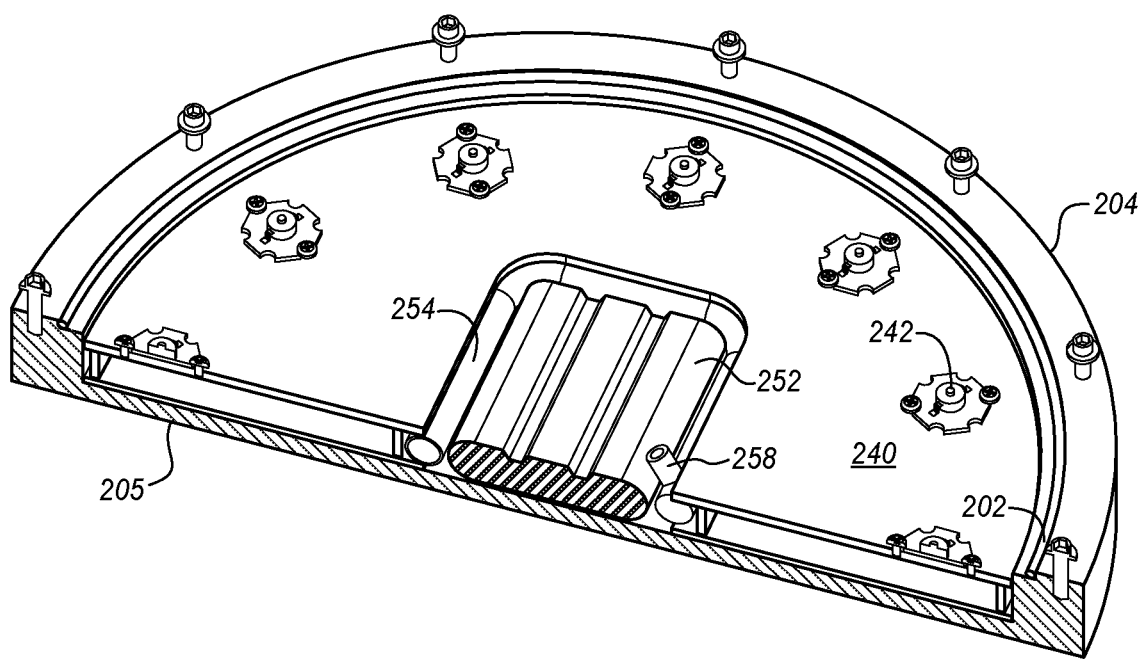
FIG. 6 is an isometric cross-sectional view of a desorption device with the top cover removed according to an embodiment.

FIG. 6 is an isometric diagram of the main housing and chassis with a cross-sectional view of the combination. The main housing has a bottom surface 205 that is substantially flat to mimic the bottom surface of a wafer or other substrate for which the processing chamber is designed. The bottom surface is made of a resilient thermally non-conductive material such as a polyethylene that allows the desorption device to rest on a chuck, pedestal, or other wafer carrier without damaging or marring the top surface of the carrier. The material is also dielectric so that there are no electrical connections made to any features on the carrier. The bottom surface of the main housing serves as a thermal and electrical barrier between the chassis and the wafer carrier inside the processing chamber. In this way, the processing chamber is not modified in order to support the desorption device.

The LEDs 242 may generate substantial heat when irradiating chamber walls of the process chamber 108. In addition, the battery may generate significant heat as it is discharged. Accordingly, to maintain the LEDs and battery within an operational temperature range, and to limit the amount of heat introduced into the processing chamber the desorption device may include a heat sink thermally coupled to the LEDs, the battery, or both.

Figure 7:
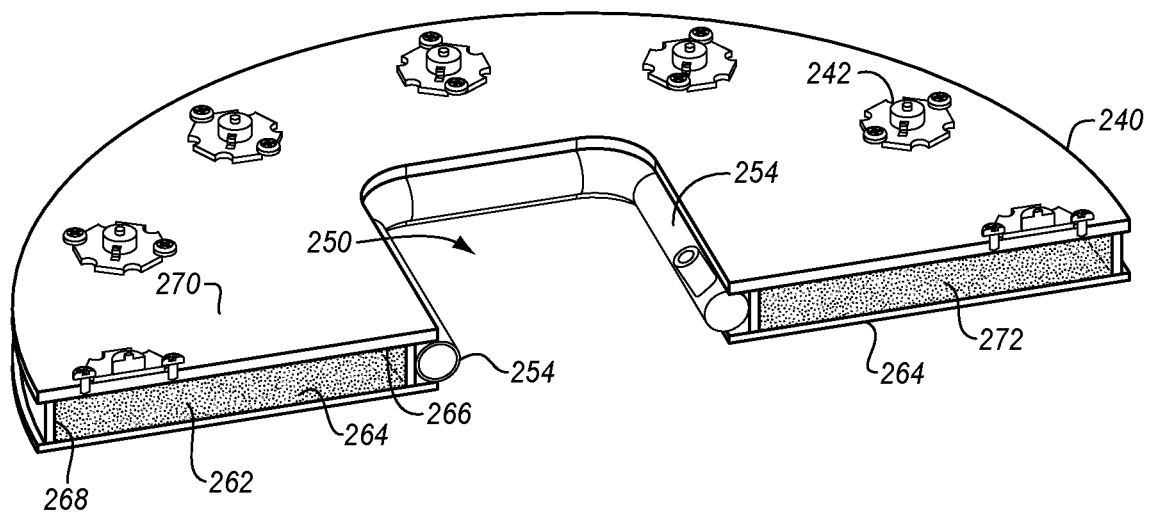
FIG. 7 is an isometric cross-sectional view of a chassis of a desorption device according to an embodiment.

FIG. 7 is an isometric and cross-sectional view of the chassis that sits within a basin in the main housing. The chassis 240 has a recess or opening 250 for the battery and carries the LEDs 242 on its top surface. In this version, the chassis also carries the coolant pipe 254 that wraps around the battery (not shown). The chassis may be made from a thermally conducting material such as aluminum or a suitable alloy. As a result, heat generated by the LEDs is conducted across the top surface of the chassis and heat generated by the battery is conducted into the heat pipe and into the chassis. The chassis is able to absorb some heat from the LEDs and the battery and thereby prevent the desorption device from heating the plasma chamber. In addition, as shown in FIG. 6, the chassis is isolated from the plasma chamber by the main housing 204 and as shown in FIG. 2 by the top cover 206. The thermally isolating material of the main housing and the top cover together with the gasket 202 between the connection between the main housing and the top cover help to isolate the internal heating of the desorption device from the plasma chamber.

In addition to the isolation and conduction, the chassis may also include an internal heat sink to absorb heat from the LEDs and the battery. Any of a variety of different heat sinks may be used. In some embodiments a phase change material is thermally coupled to the conductive body of the chassis to absorb heat from the chassis. In FIG. 7, there is an internal cavity 262 within the chassis 240. This cavity is formed by the top surface 270 to which the LEDs are attached, the bottom surface 264 that rests in the basin of the main housing, an inner peripheral wall 268, and the heat pipe 254. These four structures define a roughly annular cavity around the entire chassis. All or part of this cavity may be filled with a heat sink material. As the structure of the chassis is warmed by the devices that are thermally coupled to it, then the heat is conducted through the chassis into the heat sink. As the heat sink absorbs the heat then a thermally conductive path is established from any heat sources into the heat sink.

A variety of different techniques may be employed for the heat sink. As mentioned above, a phase change material may be employed. In some embodiments, the cavity is partially or entirely filled with a metal foam 272. The metal foam may be filled with a phase change material PCM, such as paraffin, beeswax, salt hydrates, etc. A grid or tubular network filled with a PCM material may also be used. As the LEDs and the battery generate heat, the heat is applied to the PCM and the PCM absorbs the heat in a phase change. For paraffin, the material transitions from solid to liquid and possibly to gas. After the leak test or the UV light cycle is completed, then the desorption device may be cooled using, for example, the coolant pipe couplers, and the PCM is returned to its original, e.g. solid, state. The battery may also be charged or alternatively a flywheel or other power source may be energized.

Alternatively or in addition a Peltier device may be used within the cavity 262 to transfer heat from a hot side near the LEDs and battery to a cold side at the periphery 268 of the cavity using the Peltier effect. When heat is transferred to the peripheral walls, it may disperse within the main housing 204 causing the main housing to act as a heat sink. By retaining heat within the main housing the heat transfer to the evacuated process chamber is reduced. This reduces the effect of the heat from the desorption device on the predetermined test pressure within the process chamber. The Peltier device may be used together with a PCM.

Figure 8:
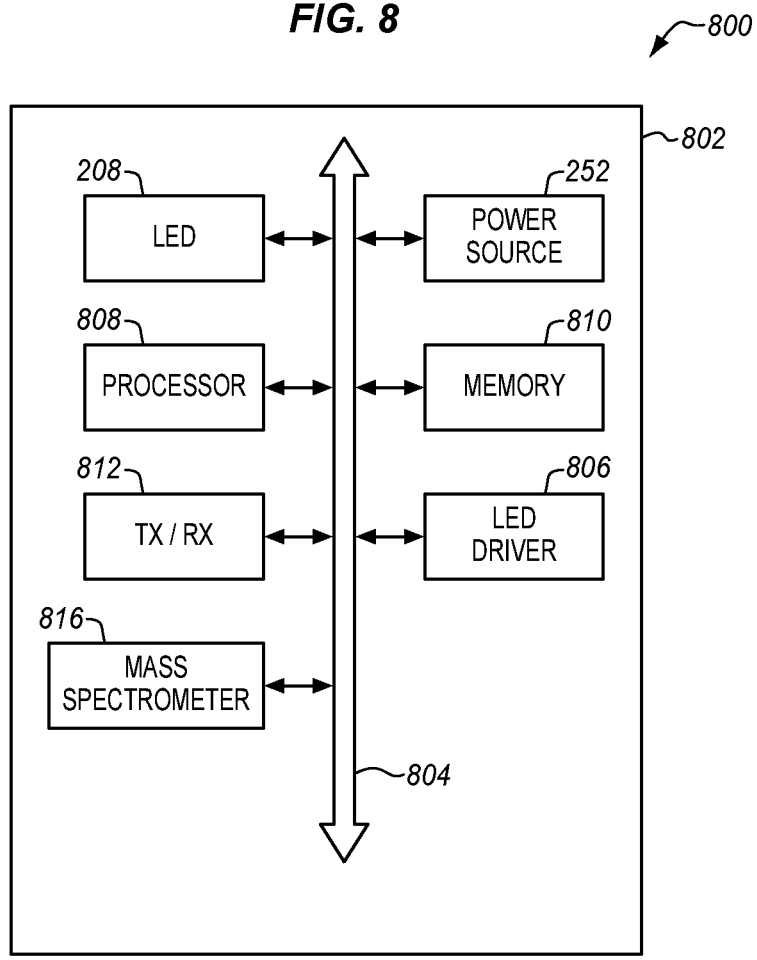
FIG. 8 is a block diagram of an electrical system of a desorption device according to an embodiment.

FIG. 8 is a block diagram of an electrical system suitable for a desorption device as described. The electrical system 800 may be enclosed or supported in the main housing 202 or on the exterior of the device and exposed to the process chamber. An electrical housing 802 and components of the electrical system 800 may be mounted on an outer surface of the main housing or attached to the chassis within the main housing. The components of the electrical system 800 may be electrically interconnected through an electrical bus 804, electrical trace, electrical lead, or via.

In this embodiment the electrical system is formed of electronic circuitry and components that include the LEDs 208 mounted on the chassis top surface 270. As described above, the LEDs emit UV radiation when electrically powered by a power source, such as a battery 252. At least a portion of the UV radiation is in the UV-C range which is more effective for water desorption. The UV-C range is between about 100 to 280 nm and 255 nm or less in particular. In an embodiment, at least 10% of the UV radiation emitted by LEDs has a wavelength of 190+/−10 nm. Power output of each LED may vary based on the current draw. For example, each LED may output 4-6 mW at a constant current of 100 mA, or 12-18 mW at a constant current of 300 mA.

The electronic circuitry 800 may include a processor 808, an LED driver 806, and a memory 810. The electrical power supplied to the LEDs may be adjusted by the LED driver to provide sufficient power to irradiate chamber surface areas of various sizes, irradiance power may positively correlate with chamber volume. For example, the LEDs may be controlled to output higher irradiance when the desorption device is located within a process chamber 108 as compared to when the desorption device is located within a load lock 106. Electrical power from the battery may be controlled by one or more external components, e.g., a switch, an LED driver, etc., to provide regulated voltage direct current to the LEDs. Such external components may include or be separately controlled by the operation of logic circuits, such as by a feedback circuit or the processor to regulate output voltage.

The processor 808 may include one or more general-purpose processing devices such as a microprocessor, central processing unit, or the like. The processor may be a complex instruction set computing (CISC) microprocessor, reduced instruction set computing (RISC) microprocessor, very long instruction word (VLIW) microprocessor, a processor implementing other instruction sets, or processors implementing a combination of instruction sets. The processor may also be one or more special-purpose processing devices such as an application specific integrated circuit (ASIC), a field programmable gate array (FPGA), a digital signal processor (DSP), network processor, or the like.

The processor 808 is configured to execute processing logic for performing the operations described herein. For example, the processor 808 may control a feedback circuit to regulate the electrical voltage or electrical current output from the power source such that the LEDs are adequately powered to generate UV radiation having a predetermined wavelength, e.g., UVC rays.

The memory 810 may include one or more of a main memory (e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), or a secondary memory (e.g., a data storage device). The processor may communicate with the memory via the bus or other electrical connection or the memory may be within the processor.

The LED driver 806 controls an LED output. In an embodiment, the electronic circuitry includes electronic components 812 to allow for the desorption device to be remotely actuated, such as a transmitter, receiver, or transceiver 812 placed in electrical communication with the processor or the LED driver, and remotely operable by corresponding circuitry controlled by a user external to the processing tool. Accordingly, the user may remotely actuate the LEDs to start and stop irradiation of the process chamber by sending commands to the transceiver from a remote control, without the need to open and close the process chamber to control the desorption device. The transceiver may also be used to send data to the remote control. For example the transceiver may send status and environmental sensor data to the remote control.

Figure 9:
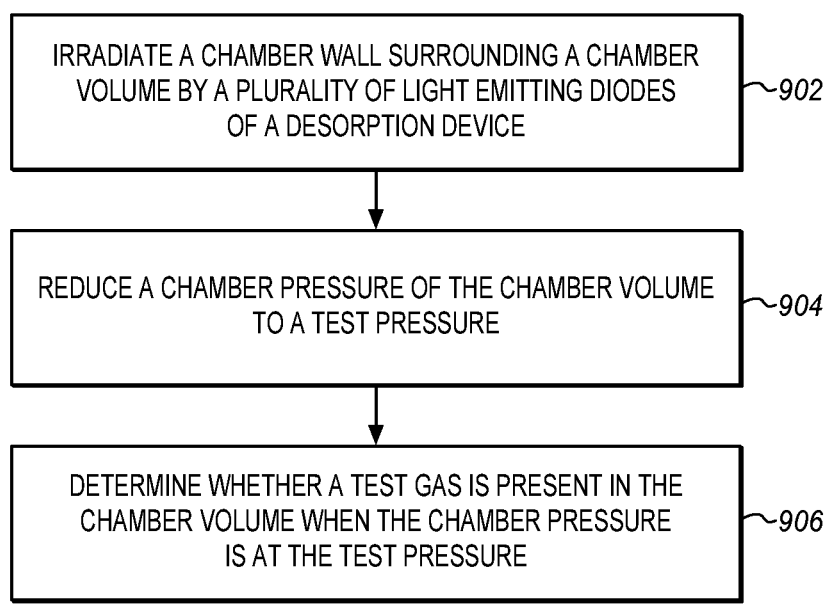
FIG. 9 is a process flow diagram of desorbing molecules from the inner walls of a processing chamber according to an embodiment.

Referring to FIG. 9, a flowchart representing operations in a method of desorbing molecules from a chamber wall is illustrated in accordance with an embodiment. The desorption device has a geometric shape resembling a traditional semiconductor wafer, and can therefore be loaded into the wafer processing tool or process chamber. In an embodiment, the bottom surface 205 of the desorption device can be mounted on an electrostatic chuck or other wafer carrier within the process chamber. Accordingly, the desorption device can be manually or automatically transferred into the process chamber and the process chamber may be sealed for leak testing.

At operation 902, the desorption device may be actuated to irradiate the process chamber. Actuation of the desorption device may be performed remotely to turn on the LEDs. The UV radiation emitted by the LEDs irradiates the chamber wall. Some radiation may be reflected from the walls so that the UV radiation fills most or all of the chamber.

At operation 904, a chamber pressure of the chamber volume may be reduced to a test pressure. A rough pump in fluid communication with the chamber volume may begin evacuating the chamber volume before or after the LEDs are actuated. For example, the LEDs may be turned on via a remote connection before or after the rough pump has started. Evacuation of the chamber volume may continue until the test pressure is reached. For example, the test pressure may be equal to or less than $1 \times 10^{-4}$ Torr. More particularly, the test pressure may be a level at which a leak detector in fluid communication with the chamber volume is most efficiently operated.

In an embodiment, the LEDs are actuated for a predetermined amount of time. Alternatively, the LEDs may remain on, i.e., irradiation of the chamber walls may occur, until the test pressure is reached. When the test pressure is reached, the LEDs may be turned off via the remote connection. Similarly, the LEDs may be turned off when the predetermined amount of time has expired.

At operation 906, a determination may be made as to whether a test gas is present in the chamber volume. For example, a leak detector may be used when the chamber pressure is at the test pressure to detect whether the test gas, e.g., helium, has infiltrated the chamber volume from an external location. By way of example, helium may be applied to an outer surface of a gasket or an O-ring of the process chamber, and if a leak in the tested seal is present, the helium will be sucked into the chamber volume toward the leak detector. When the leak detector senses the test gas, the leak can be detected and communicated to the user. Accordingly, appropriate manufacturing rework operations may be undertaken to repair the process chamber.

In an embodiment, a mass spectrometer 816 may be integrated into the desorption device. The mass spectrometer may be electrically connected with any other component of the electronic circuitry 800 through the bus 804. For example, the onboard mass spectrometer may provide electrical signals corresponding to sensed molecules to the processor. Furthermore, the electronic circuitry 800 may use the transmit/receive module 812 to communicate data generated by the desorption device to a remote computer. For example, the processor may control the wireless transmitter to transmit data corresponding to test gases detected by the mass spectrometer or other components to an external device to signal to a user that a leak is present.

The desorption device may provide faster pump down times of a process chamber than can be achieved using the rough vacuum pump alone. For example, in some cases, the desorption device can reduce the pump down time by at least 50% as compared to evacuating a process chamber using the rough pump alone. This allows for leak testing of all types of process chambers to be performed in less time.

Figure 10:
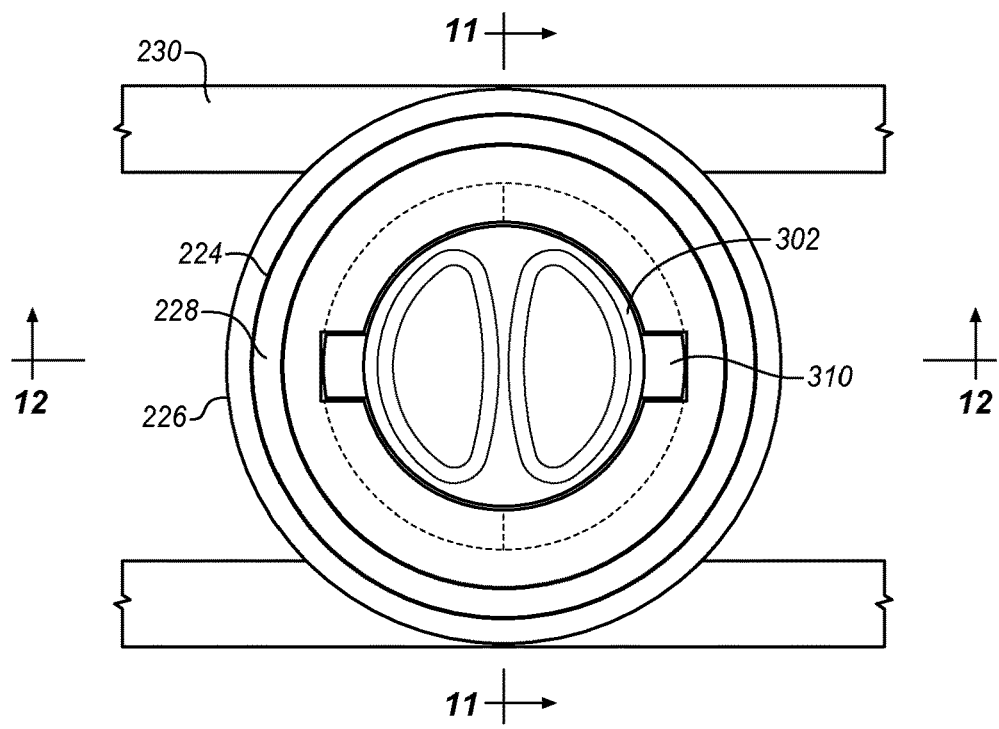
FIG. 10 is a top plan view of button in a port cover of the desorption device to hold the port cover in place according to an embodiment.
Figure 11:
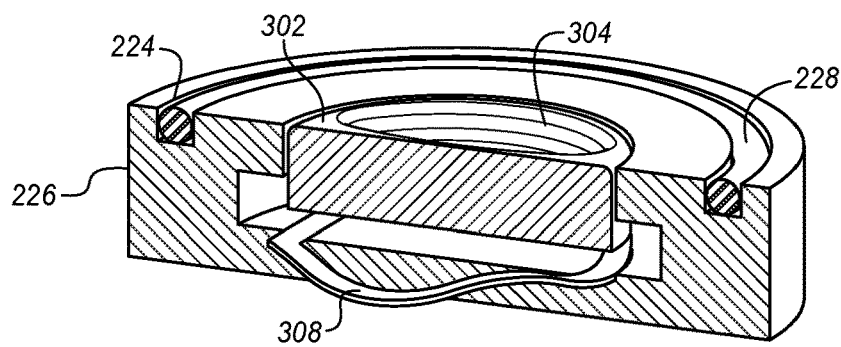
FIG. 11 is a side cross-sectional view of the button and port cover of FIG. 10 along line 11-11 with the button in a lowered position according to an embodiment.
Figure 12:
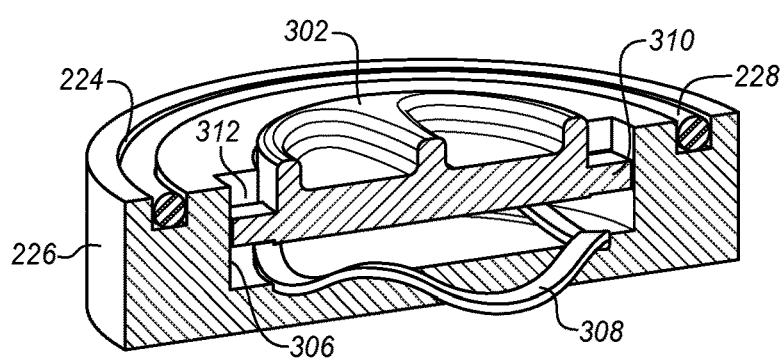
FIG. 12 is a side cross-sectional view of the button and port cover of FIG. 10 along line 12-12 in a raised position according to an embodiment.

FIG. 10 is a top view of a spring-loaded button that may be used to hold the port cover 226 in position sliding with respect to the top cover 206. FIG. 11 is a side cross-sectional view of the button in a lowered position and FIG. 12 is a side cross-sectional view of the button in a raised locking position. The button 302 may be placed in a first position as shown in FIG. 11 in which the port cover and the button are able to slide under the top cover. The button may be placed in a second position as shown in FIG. 12 in which it protrudes above the port cover and into the access port 212 to prevent the port cover from sliding in at least one direction. As shown, the button 302 is round and is mounted in the port cover 226. The button may be made larger or smaller to fill more or less of the access port 212 (as shown in FIG. 3).

The button 302 is mounted into an internal pocket 306 in the port cover 226. The button has peripheral tabs with an upper horizontal surface 310 that engage bottom surfaces of corresponding tabs 312 of the port cover that extend from the sides of the pocket toward the button. The tabs 312 of the cover prevent the tabs 310 of the button from moving upwards. A spring 308 or spring washer pushes the button upward against the tabs. There may be two sets of port cover tabs each in a different vertical position to allow the button to be held in either of two different vertical positions. The higher vertical position is higher than the top of the port cover and causes the button to butt up against the side of the access port when the port cover is moved too far on its rails 230. The lower position keeps the button free of the side walls of the top cover access port and allows the access port cover to be opened fully.

The button includes indentations 304, a knob, a ridge, or other handle to allow the button to be grasped, pushed, and rotated. In the illustrated example, the indentations are in the form of two facing semicircular indentations. The indentations allow fingers or a tool to rotate the button. In addition, as indentations, no vertical height is added to the button for the handle. A lower vertical profile allows the button to more easily be pushed down to slide under the port cover to open the access port.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A desorption device for a processing chamber, the device comprising:
    a chassis;
    a plurality of light emitting diodes (LEDs) mounted to the chassis, wherein the plurality of LEDs emit ultraviolet (UV) radiation when electrically powered;
    a thermally non-conductive main housing surrounding a bottom surface and sidewall surfaces of the chassis and configured to be placed on a wafer carrier that is transferrable between processing chambers; and
    an electrical system to activate the LEDs within the processing chamber.

2. The device of claim 1, wherein the chassis is formed of a thermally conductive material and the LEDs are thermally coupled to the chassis.

3. The device of claim 1, wherein the main housing comprises a bottom surface, wherein the chassis is on one side of the bottom surface and the other side of the bottom surface is configured to be placed on the wafer carrier, so that the bottom surface thermally isolates the wafer carrier from the chassis.

4. The device of claim 1, wherein the chassis further comprises a heat sink thermally coupled to the LEDs to absorb heat from the LEDs when the LEDs are activated.

5. The device of claim 4, wherein the heat sink comprises a phase change material.

6. The device of claim 5, wherein the chassis includes a cavity and wherein the phase change material is within the cavity.

7. The device of claim 6, wherein the phase change material comprises a paraffin filled metal foam.

8. The device of claim 4, wherein the chassis further comprises a battery well and wherein the battery well is thermally coupled to the heat sink through the chassis.

9. The device of claim 1, further comprising a top cover removably attached to the main housing to cover the chassis and to thermally isolate the chassis from the processing chamber.

10. The device of claim 9, wherein the top cover further comprises a window for each LED to allow the radiation from each LED to propagate through a respective window to the processing chamber.

11. The device of claim 10, wherein the top cover comprises a carrier for each window, the carrier having a gasket, a gasket seat, and an opening to allow radiation to propagate through the top cover, the gasket seat being between the window and the gasket seat so that the gasket is compressed when the window is pressed outward from the chassis toward the top cover.

12. The device of claim 9, further comprising an access port through the top cover and a port cover, the port cover being carried by rails attached to a bottom side of the top cover, the port cover having a groove to carry a gasket between the port cover and the top cover so that the gasket is compressed when the port cover is pressed outward from the chassis toward the top cover.

13. The device of claim 12, wherein the chassis further comprises a battery well and wherein the battery well comprises a coolant pipe configured to be thermally coupled to a battery when a battery is in the battery well, the coolant pipe having couplings below the top cover access port so that a coolant may be supplied to the coolant pipe when the access port is in an open position.

14. The device of claim 1, wherein the UV radiation is in a UV-C range.

15. The device of claim 1, wherein the plurality of LEDs include a first set of LEDs mounted symmetrically about a central axis extending orthogonal to a top surface of the chassis.

16. An apparatus comprising:
a processing chamber with vacuum seals;
a vacuum pump to evacuate the chamber;
an access door to insert a wafer; and
a desorption device accessible through the access door, the device including a chassis, a plurality of light emitting diodes (LEDs) mounted to the chassis, wherein the plurality of LEDs emit ultraviolet (UV) radiation when electrically powered, a thermally non-conductive main housing surrounding a bottom surface and sidewall surfaces of the chassis and configured to be placed on a wafer carrier that is transferrable between processing chambers, and an electrical system to activate the LEDs within the processing chamber.

17. The apparatus of claim 16, the desorption device further comprising a transceiver to receive commands from a remote control to actuate the LEDs.

18. The apparatus of claim 16, wherein the desorption device further comprises a top cover over the housing, an access port through the top cover, and a port cover, the port cover being carried by rails attached to a bottom side of the top cover, the port cover having a spring loaded button to maintain the port cover in a closed position during use.

* * * * *